(12) United States Patent
Kang et al.

(10) Patent No.: US 7,989,791 B2
(45) Date of Patent: Aug. 2, 2011

(54) DIODE STRUCTURE AND MEMORY DEVICE INCLUDING THE SAME

(75) Inventors: Bo-soo Kang, Seoul (KR); Stefanovich Genrikh, Suwon-si (KR); Young-soo Park, Yongin-si (KR); Myoung-jae Lee, Suwon-si (KR); Seung-eon Ahn, Suwon-si (KR); Chang-bum Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 524 days.

(21) Appl. No.: 12/076,311

(22) Filed: Mar. 17, 2008

(65) Prior Publication Data
US 2009/0045429 A1  Feb. 19, 2009

(30) Foreign Application Priority Data
Aug. 17, 2007  (KR) .................. 10-2007-0082989

(51) Int. Cl.
*H01L 29/12* (2006.01)

(52) U.S. Cl. ............... 257/2; 257/29.327; 257/29.33; 365/148; 365/175

(58) Field of Classification Search .......... 365/148, 365/174, 175; 257/1, 2, 4, 5, 7, 577, E27.016, 257/E27.051, E29.327, E29.33
See application file for complete search history.

(56) References Cited

U.S. PATENT DOCUMENTS

| | | | |
|---|---|---|---|
| 6,258,702 B1 * | 7/2001 | Nakagawa et al. | 438/570 |
| 7,208,372 B2 * | 4/2007 | Hsu et al. | 438/257 |
| 7,329,915 B2 * | 2/2008 | Herman et al. | 257/288 |
| 2009/0302297 A1 * | 12/2009 | Park et al. | 257/3 |

* cited by examiner

*Primary Examiner* — Evan Pert
*Assistant Examiner* — Eduardo A Rodela
(74) *Attorney, Agent, or Firm* — Harness, Dickey & Pierce, P.L.C.

(57) ABSTRACT

Provided are a diode structure and a memory device including the same. The diode structure includes: a first electrode; a p-type Cu oxide layer formed on the first electrode; an n-type InZn oxide layer formed on the p-type Cu oxide layer; and a second electrode formed on the n-type InZn oxide.

12 Claims, 4 Drawing Sheets

DIODE STRUCTURE AND MEMORY DEVICE INCLUDING THE SAME

CROSS-REFERENCE TO RELATED PATENT APPLICATION

This application claims the benefit of Korean Patent Application No. 10-2007-0082989, filed on Aug. 17, 2007, in the Korean Intellectual Property Office, the disclosure of which is incorporated herein in its entirety by reference.

BACKGROUND OF THE INVENTION

1. Field of the Invention

The present invention relates to a diode structure and a memory device including the same, and more particularly, to a new diode structure including a compound of material having an excellent rectification property, and a memory device including the new diode structure.

2. Description of the Related Art

Many semiconductor devices comprising semiconductor memories include a switching structure. For example, a dynamic random access memory (DRAM), which is a representative memory device, includes among other elements a switching structure and a capacitor. A transistor, a diode, a varistor, and the like are examples of the switching structure.

To realize a highly integrated semiconductor device able to store mass information in a small area, a switching structure having a simple structure is required. In particular, a device such as a resistive random access memory device, which has recently undergone much research, has a cross-point structure in order to maximize integration.

A diode used for a semiconductor device preferably has a high current density in order to improve integration of the semiconductor device, a low leakage current due to a high ON/OFF current ratio, and a short response time with respect to a pulse signal.

SUMMARY OF THE INVENTION

The present invention provides a semiconductor diode including a new material and thus having an excellent rectification property and a short response speed, and a memory device including the semiconductor diode.

The present invention also provides a diode structure, including: a first electrode; a p-type Cu oxide layer formed on the first electrode; an n-type InZn oxide layer formed on the p-type Cu oxide layer; and a second electrode formed on the n-type InZn oxide.

The p-type Cu oxide layer may include CuO.

The n-type InZn oxide layer may include $In_2Zn_2O_5$.

The first electrode and the second electrode may be formed of a metal or a conductive metal oxide.

According to another aspect of the present invention, there is provided a resistive random access memory device including: a first electrode; a first p-type Cu oxide layer formed on the first electrode; an n-type InZn oxide layer formed on the p-type Cu oxide layer; a second p-type Cu oxide layer formed on the n-type InZn oxide; a variable resistance layer formed on the second electrode; and a third electrode formed on the variable resistance layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
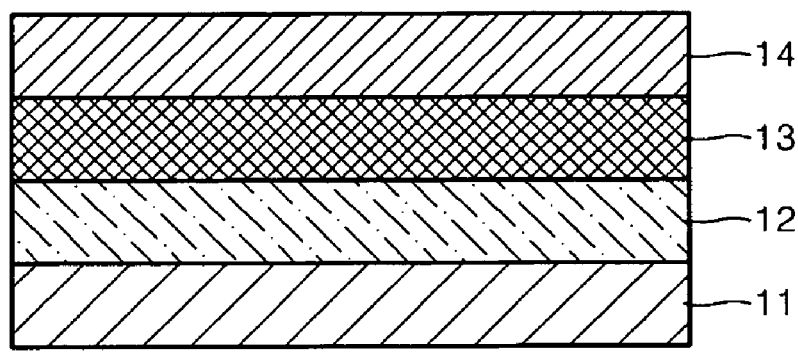
FIG. 1 is a cross-sectional view illustrating a diode structure according to an embodiment of the present invention.

The present invention will now be described more fully with reference to the accompanying drawings according to embodiments of the present invention. In the drawings, the thicknesses of layers and regions are exaggerated for clarity.

FIG. 1 is a cross-sectional view illustrating a diode structure according to an embodiment of the present invention.

Referring to FIG. 1, a diode structure according to an embodiment of the present invention includes a first electrode 11, a p-type Cu oxide layer 12 formed on the first electrode 11, an n-type InZn oxide layer 13 formed on the p-type Cu oxide layer 12, and a second electrode 14 formed on the n-type InZn oxide layer 13.

A method of manufacturing the diode structure according to an embodiment of the present invention will now be described. First, the first electrode 11 is formed of a conductive material such as a metal or a metal oxide. For example, the first electrode 11 may be formed of Al, Hf, Zr, Zn, W, Co, Au, Pt, Ru, Ir, Ti, or a conductive metal oxide. The p-type Cu oxide layer 12, for example, p-type CuO, and the n-type InZn oxide layer 13, for example, n-type InZnO, are formed on an upper portion of the first electrode 11. Similarly to the first electrode 11, a second electrode 14 is formed of a conductive material such as a metal or metal oxide on the n-type InZn oxide layer 13. The diode structure according to an embodiment of the present invention may be formed by a physical vapor deposition (PVD) method, an atomic layer deposition (ALD) method, or a chemical vapor deposition (CVD) method.

Figure 3:
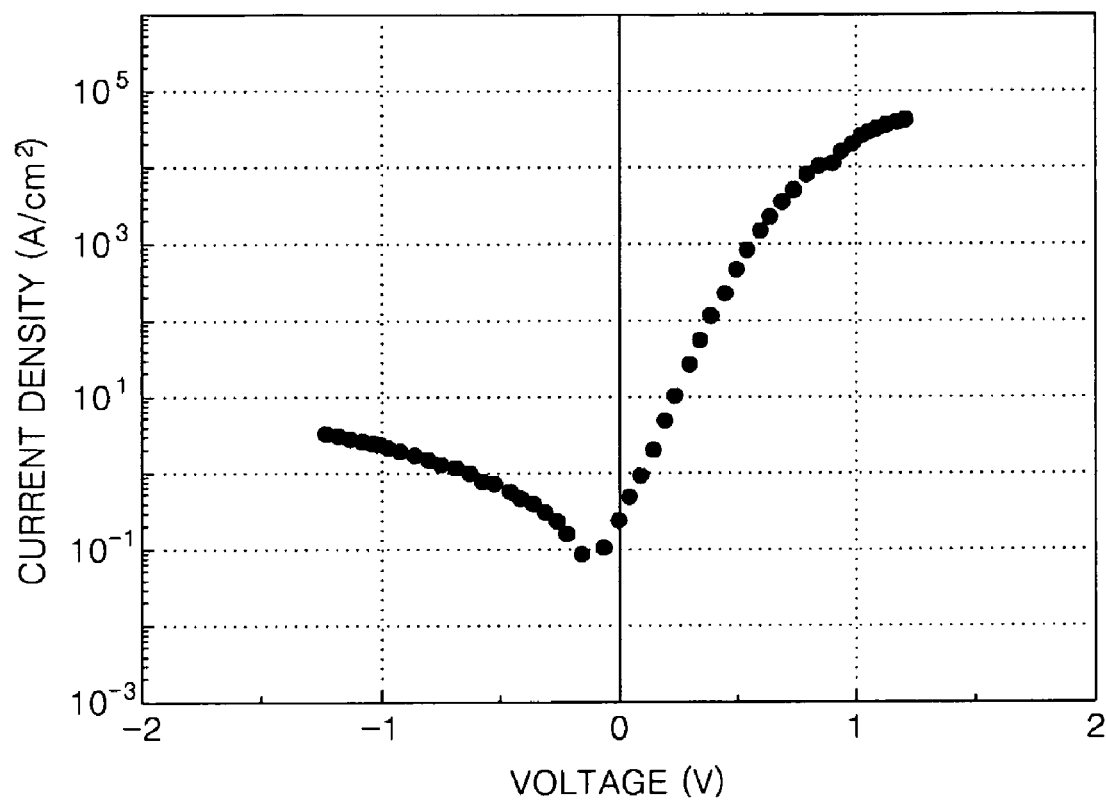
FIG. 3 is a graph illustrating a voltage-current property of a diode structure according to an embodiment of the present invention.

An electric property of a diode structure according to an embodiment of the present invention will now be described with reference to FIG. 3. Here, both of the first electrode 11 and the second electrode 14 of the diode structure are formed of Pt. In the graph of FIG. 3, the horizontal axis represents the size of voltage applied to both end portions of the first electrode 11 and the second electrode 14, and the vertical axis represents current density ($A/cm^2$).

Referring to FIG. 3, the diode structure according to an embodiment of the present invention has a high forward current density of more than $3*10^4$ $A/cm^2$ at about 1.2V, and has an forward/reverse current ratio value of more than $10^4$. As a result, the diode structure according to an embodiment of the present invention has an excellent rectification property, and thereby can be used in semiconductor memory devices.

Figure 2:
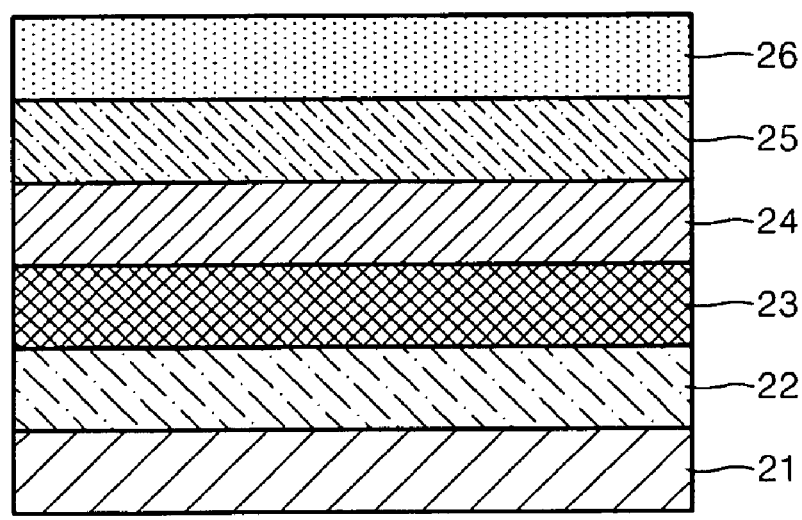
FIG. 2 is a cross-sectional view illustrating a resistive random access memory device including a diode structure according to an embodiment of the present invention.

FIG. 2 is a cross-sectional view illustrating a resistive random access memory device including a diode structure according to an embodiment of the present invention. The diode structure according to an embodiment of the present invention can be used in various semiconductor devices as well as in resistive random access memory devices.

Referring to FIG. 2, the diode structure includes a first electrode 21, a p-type Cu oxide layer 22 formed on the first electrode 21, an n-type InZn oxide layer 23 formed on the p-type Cu oxide layer 22, a second electrode 24 formed on the n-type InZn oxide layer 23, a variable resistance layer 25 formed on the second electrode 24, and a third electrode 26 formed on the variable resistance layer 25.

The variable resistance layer 25 may be formed of variable resistance material used in general resistive random access memory devices. The variable resistance material has more than two resistance values when current is applied. The variable resistance layer 25 may be formed of a transition metal oxide (TMO) such as Ni oxide, Ti oxide, Hf oxide, Zr oxide, Zn oxide, W oxide, Co oxide, Cu oxide, Nb oxide, and the like, and also may be formed of a perovskite metal oxide ($SrTiO_3$, $(Pr,Ca)MnO_3$, $BaTiO_3$, $PbTiO_3$) and the like.

Similarly to the first electrode 21 and the second electrode 24, the third electrode 26 may be formed of Al, Hf, Zr, Zn, W, Co, Au, Pt, Ru, Ir, Ti, or a conductive metal oxide.

Figure 4:
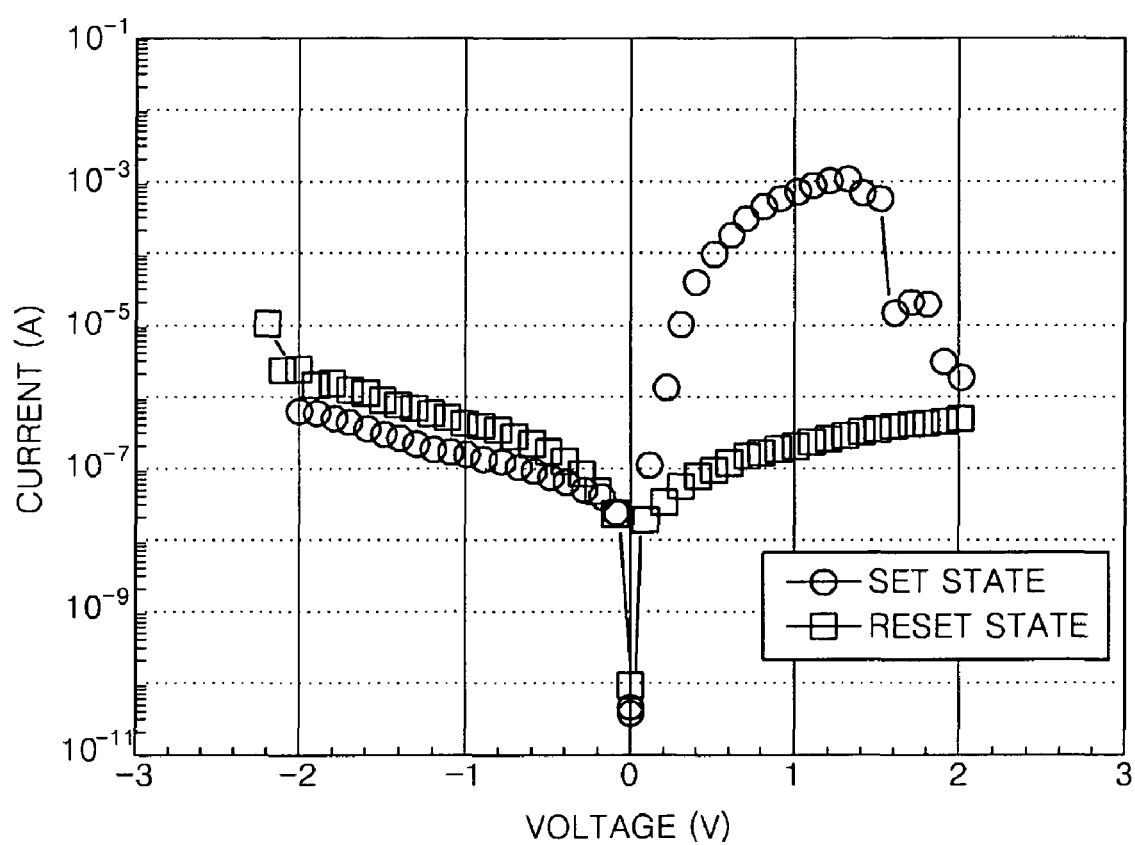
FIG. 4 is a graph illustrating an electric property of a resistive random access memory device including a diode structure according to an embodiment of the present invention.

FIG. 4 is a graph illustrating an electric property of a resistive random access memory device including a diode structure of FIG. 1. Referring to FIG. 4, when a positive voltage and a negative voltage are respectively applied to electrodes at both end portions of the resistive random access memory device, a plot of current values with respect to the positive voltage is asymmetric with respect to a plot of current values with respect to the negative voltage.

Figure 5:
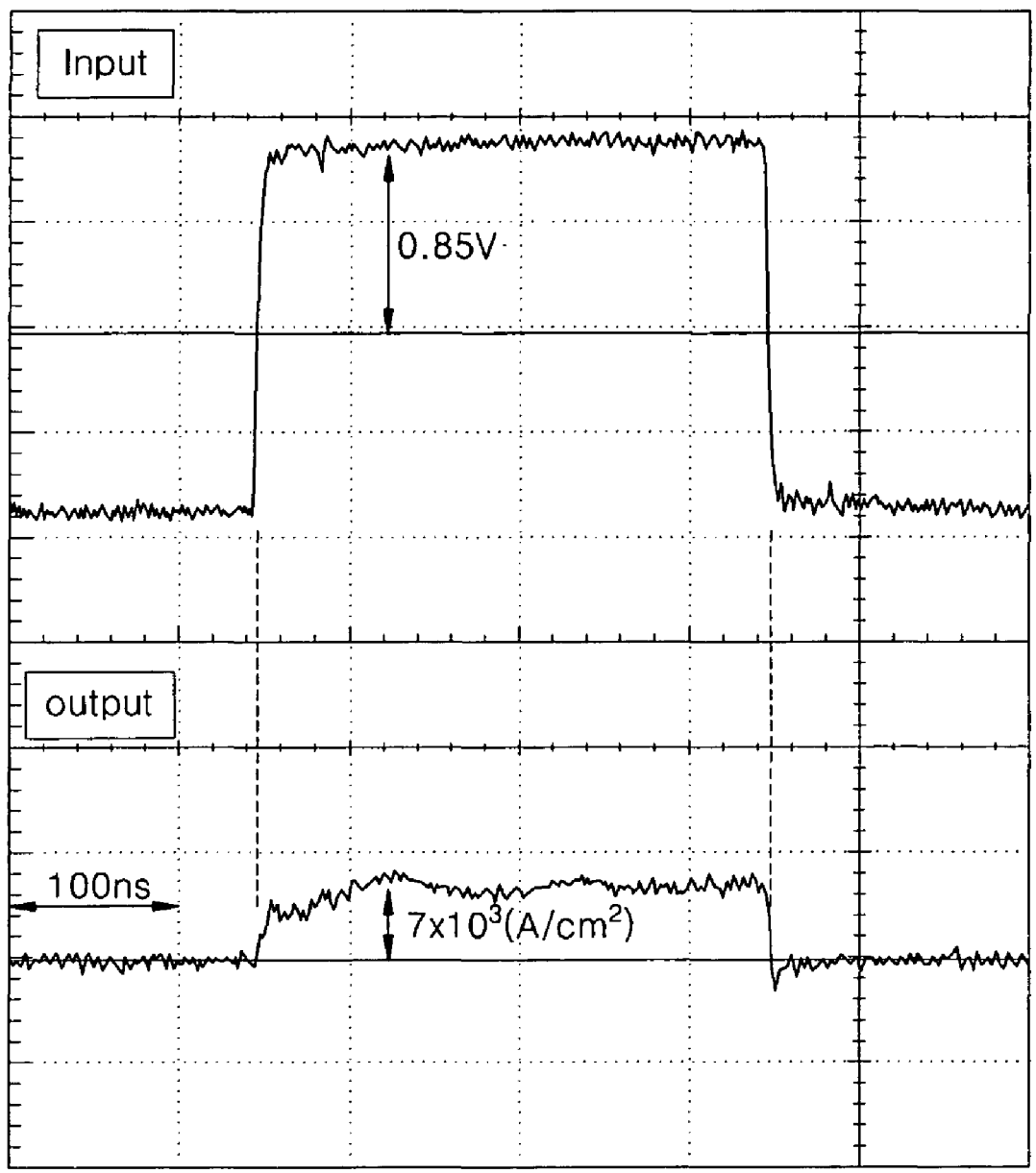
FIG. 5 is an image illustrating an operational property with respect to a pulse signal of a diode structure according to an embodiment of the present invention.

FIG. 5 is an image illustrating an operational property with respect to a pulse signal of a diode structure according to an embodiment of the present invention. In the present embodiment, the diode structure uses Pt as a lower electrode and an upper electrode, and includes CuO/InZnO formed between the lower electrode and the upper electrode. When a pulse signal is applied to the lower electrode and the upper electrode, an output signal of about 10 ns is generated, the diode structure thus having a short response time.

According to the present invention, a semiconductor diode having an excellent rectification property and a short response time is provided. Also, a resistive random access memory device having a highly integrated 1D (diode)-1R (resistance) structure is provided by using the semiconductor diode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A diode structure, comprising:
a first electrode;
a p-type Cu oxide layer formed on the first electrode;
an n-type InZn oxide layer formed on the p-type Cu oxide layer; and
a second electrode formed on the n-type InZn oxide, wherein the n-type InZn oxide layer includes $In_2Zn_2O_5$.

2. The diode structure of claim 1, wherein the p-type Cu oxide layer comprises CuO.

3. The diode structure of claim 1, wherein the n-type InZn oxide layer comprises InZnO.

4. The diode structure of claim 1, wherein the first electrode and the second electrode are formed of a metal or a conductive metal oxide.

5. A resistive random access memory device, comprising:
a first electrode;
a first p-type Cu oxide layer formed on the first electrode;
an n-type InZn oxide layer formed on the p-type Cu oxide layer;
a second electrode formed on the n-type InZn oxide;
a variable resistance layer formed on the second electrode; and
a third electrode formed on the variable resistance layer, wherein the n-type InZn oxide layer includes $In_2Zn_2O_5$.

6. The resistive random access memory device of claim 5, wherein the p-type Cu oxide layer comprises CuO.

7. The resistive random access memory device of claim 5, wherein the n-type InZn oxide layer comprises InZnO.

8. The resistive random access memory device of claim 5, wherein the variable resistance layer is formed of a transition metal oxide (TMO) or a perovskite metal oxide ($SrTiO_3$, $(Pr,Ca)MnO_3$, $BaTiO_3$, $PbTiO_3$).

9. A resistive random access memory device, comprising:
a first electrode;
a first p-type Cu oxide layer on the first electrode;
an n-type InZn oxide layer on the p-type Cu oxide layer;
a second electrode on the n-type InZn oxide;
a variable resistance layer on the second electrode; and
a third electrode on the variable resistance layer, wherein the variable resistance layer directly contacts the second electrode and the second electrode directly contacts the n-type InZn oxide layer.

10. The resistive random access memory device of claim 9, wherein the p-type Cu oxide layer comprises CuO.

11. The resistive random access memory device of claim 9, wherein the n-type InZn oxide layer comprises InZnO.

12. The resistive random access memory device of claim 9, wherein the variable resistance layer is formed of a transition metal oxide (TMO) or a perovskite metal oxide ($SrTiO_3$, $(Pr,Ca)MnO_3$, $BaTiO_3$, $PbTiO_3$).

* * * * *